United States Patent
Miyanari et al.

(10) Patent No.: US 7,563,036 B2
(45) Date of Patent: Jul. 21, 2009

(54) OPTICAL ELEMENT MODULE AND METHOD OF ASSEMBLING THE OPTICAL ELEMENT MODULE

(75) Inventors: Motonori Miyanari, Susono (JP); Naoshi Serizawa, Susono (JP); Hisao Matsukura, Ageo (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/867,027

(22) Filed: Oct. 4, 2007

(65) Prior Publication Data

US 2008/0267563 A1  Oct. 30, 2008

(30) Foreign Application Priority Data

Oct. 4, 2006  (JP)  .............................. 2006-272529

(51) Int. Cl.
*G02B 6/36* (2006.01)
*G02B 6/10* (2006.01)

(52) U.S. Cl. .............................. 385/93; 385/92; 385/88; 264/1.24; 264/1.25

(58) Field of Classification Search .................... 385/92, 385/93, 94, 88, 89, 31, 32, 33, 34, 14; 264/1.1, 264/1.24, 1.32, 1.25
See application file for complete search history.

(56) References Cited

U.S. PATENT DOCUMENTS

| | | | | |
|---|---|---|---|---|
| 4,421,383 A | * | 12/1983 | Carlsen | 385/79 |
| 4,718,744 A | * | 1/1988 | Manning | 385/79 |
| 5,495,545 A | * | 2/1996 | Cina et al. | 385/92 |
| 5,526,455 A | * | 6/1996 | Akita et al. | 385/93 |
| 6,206,577 B1 | * | 3/2001 | Hall, III et al. | 385/53 |
| 6,302,596 B1 | | 10/2001 | Cohen et al. | 385/93 |
| 6,769,816 B2 | * | 8/2004 | Capewell et al. | 385/89 |
| 2005/0244110 A1 | | 11/2005 | Togami et al. | 385/92 X |
| 2008/0267563 A1 | * | 10/2008 | Miyanari et al. | 385/33 |

FOREIGN PATENT DOCUMENTS

| | | | |
|---|---|---|---|
| EP | 0-985-945 A2 | 3/2000 | 385/93 X |
| EP | 1-028-340 A1 | 8/2000 | 385/93 X |
| JP | 10-126002 A | 5/1998 | 385/93 X |
| JP | 2006-30813 A | 2/2006 | 385/92 X |

OTHER PUBLICATIONS

Extended European Search Report dated Jan. 18, 2008.

* cited by examiner

*Primary Examiner*—Brian M Healy
(74) *Attorney, Agent, or Firm*—Sughrue Mion, PLLC (57) ABSTRACT

An optical element module includes a lead frame an optical element mounted on the lead frame, a resin housing including an opening part, and a tube body. The resin housing contains a part of the lead frame on which the optical element is mounted. The tube body includes a tube part for receiving an optical fiber terminal, a lens arranged between the optical element and the optical fiber terminal, and a lid part which covers the opening part of the resin housing. The tube part, the lens and the lid part are integrally formed.

13 Claims, 7 Drawing Sheets

OPTICAL ELEMENT MODULE AND METHOD OF ASSEMBLING THE OPTICAL ELEMENT MODULE

BACKGROUND

The present invention relates to an optical element module including a light emitting element or a light receiving element to which an optical fiber terminal is opposed, and a method of assembling the optical element module.

Figure 7:
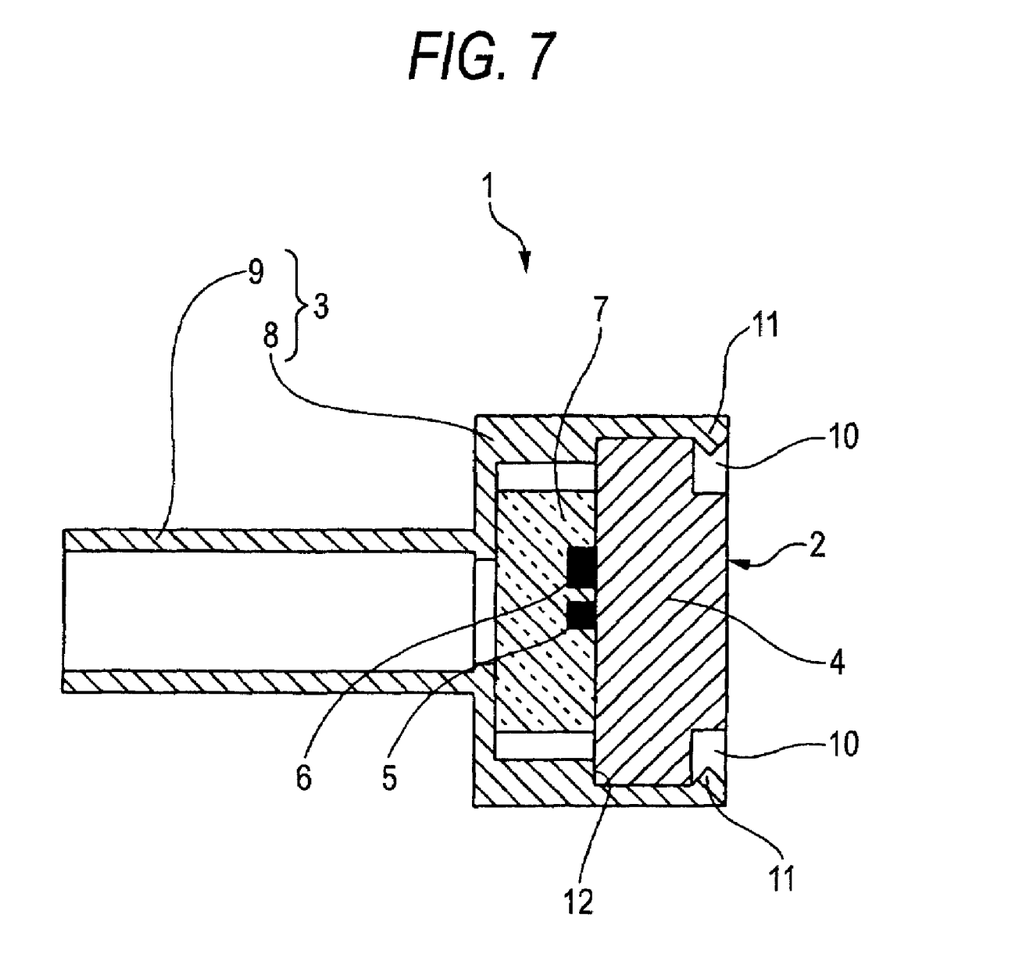
FIG. 7 is a cross-sectional view of a related art optical element module.

As a related art optical element module, one disclosed for example in JP-A-2006-30813 is known. In FIG. 7, an optical element module 1 includes a light emitting device 2 and an enclosure 3. The optical element module 1 shown in FIG. 7 serves as a light emitting side in optical communications. The light emitting device 2 includes a substrate 4, a light emitting element 5 and an electronic component 6 mounted on the front surface of the substrate 4, and a is sealing resin 7 for sealing the light emitting element 5 and the electronic component 6. The enclosure 3 includes a main body 8 and a tube body 9 for inserting optical fibers to be integrated with the main body 8 and is formed into an illustrated shape.

At the rear part of the substrate 4 of the light emitting device 2 are formed a plurality of latching concave parts 10. In the concave parts 10 are engaged latching hook parts 11 farmed on the main body 8 of the enclosure 3. The light emitting device 2 is housed in contact with a stepped part 12 inside the main body 8. The light emitting device 2 is prevented from dropping by way of the fitting engagement of the concave parts 10 and the hook parts 11.

In this arrangement, when the light emitting device 2 is fitted into the main body 8, the light emitting element 5 is exposed through the sealing resin 7 from the opening at the tip of the tube body 9 of the enclosure 3. When an optical fiber terminal is inserted into the tube body 9, the inserted optical fiber terminal is opposed to the light emitting element 5. While not illustrated, the optical fiber terminal has a ferrule mounted thereon having an outer diameter matching the inner diameter of the tube body 9.

Fixing of the light emitting device 2 and the enclosure 3 is fitting engagement made through engagement of the concave parts 10 and the hook parts 11 and requires a fitting backlash from structural standpoint. Even when the light emitting device 2 and the enclosure 3 are fixed to each other, an axial misalignment corresponding to the fitting backlash remains therebetween.

The axial misalignment causes misalignment of an optical axis between an optical fiber and the light emitting element 5 with the optical fiber inserted in the tube body 9 of the enclosure 3. That is, optical losses are generated (the optical losses become greater as the axial misalignment increases).

In recent years, the increasing amount of information transfer volume and growing needs for real-time processing require a higher transmission speed of an optical signal. A smaller light receiving area of an optical fiber is needed to attain a higher transmission speed. The problem is that a reduced light receiving area of an optical fiber may not be supported by the optical element module 1 with higher optical losses.

SUMMARY

The invention has been accomplished in view of the above circumstances. An object of the invention is to provide an optical element module capable of reducing optical losses. Another object of the invention is to provide an optical element module useful for enhancement of transmission speed.

In order to solve the problem, the invention provides an optical element module comprising:
a lead frame;
an optical element mounted on the lead frame;
a resin housing including an opening part, and contains a part of the lead frame on which the optical element is mounted; and
a tube body including: a tube part for receiving an optical fiber terminal;
a lens arranged between the optical element and the optical fiber terminal; and
a lid part which covers the opening part of the resin housing,
wherein the tube part, the lens and the lid part are integrally formed.

With the invention having such a characteristic, in case the light emitting element or light receiving element (the optical element) should be misaligned with the optical fiber thus possibly causing the optical axis to be misaligned. The lens integrated with the tube body serves to absorb the misalignment of the optical axis. This reduces optical losses. The lens is integrated with the tube body so that there is no backlash therebetween. As long as there is proper alignment between the tube body and the light emitting element or light receiving element, optical losses are reliably reduced. With the invention, action of the lens absorbs the axial misalignment of an optical fiber as well as displacement in the distance or a gap between the light emitting element or light receiving element and the end surface of the optical fiber. In this case, gap losses are reduced.

Preferably, the housing and the lid part have a non-lock concave part and a non-lock convex part, respectively, and a gap for adjusting a relative position of the housing relative to the tube body is formed between the concave part and the convex part when the convex part is inserted into the concave part.

With the invention having such a characteristic, positioning of the tube body and the enclosure is made with high precision through minute movement of the tube body using a minute backlash of the non-locking uneven part (the convex part and the concave part). In case the positioning of the enclosure and the light emitting element or light receiving element is made with high positional precision, the tube body is fixed to the enclosure while aligned with the light emitting element or light receiving element. The invention provides an excellent positioning state, which reliably reduces optical losses.

An example of high precision positioning of the tube body and the enclosure will be described. An adhesive whose time to hardening is rather long is applied to the non-locking uneven part. The tube body is minutely moved before the adhesive hardens. When alignment is complete, a temporary fixing state is formed by using an instant adhesive or the like. When the first applied adhesive hardens, the tube body is fixed to the enclosure while aligned with the light emitting element or light receiving element.

Preferably, the lead frame has a through-hole, and the housing has a marker for positioning the optical element at a position overlapped with the through-hole.

With the invention having such a characteristic, a positioning marker is formed on the enclosure using marks of an ejector pin of a forming mold. The ejector pin is arranged on the mold body with the dimensional precision of the mold so that the marker is arranged and formed by such an ejector pin with high precision. In formation of the marker, the ejector pin penetrates the through hole of the lead frame. Thus, when resin-molding is made while the lead frame is being inserted, the lead frame is prevented from being moved by the flow of resin. This completes forming of the enclosure as well as positioning of the lead frame with high precision.

In case the marker is formed using the marks of the ejector pin, the marker is arranged and formed with high precision as described above. The marker is not formed using a separate member such as a paint but formed without influencing costs. On the other hand, in case a marker is formed on the lead frame, the lead frame may be possibly moved by the flow of resin in is resin-molding of the enclosure while the lead frame is being inserted. In this case, the positional precision of the marker considerably drops.

Preferably, the lead frame has a device mounting part near the through-hole.

With the invention having such a characteristic, a marker exists in close proximity to the element mounting part of the lead frame when a light emitting element or a light receiving element is mounted on the element mounting part of the lead frame. The light emitting element or light receiving element may be mounted with high precision by using the marker as a reference.

Preferably, a part of the gap is filled with an adhesive, and inside of the optical element is communicated with outside of the optical element through a part except the part of the gap.

With the invention having such a characteristic, the part (the gap) where air moves toward the inside and outside prevents water from being generated in the optical element module due to variations in the ambient temperature.

Preferably, the optical element is Vertical Cavity Surface Emitting Laser (VCSEL) or Photo Diode (PD), and the optical fiber is Polymer Clad Fiber (PCF).

With the invention having such a characteristic, as understood from the first through fifth aspects of the invention, an optical element module capable of reducing optical losses is provided. In case the optical element module includes a light emitting element or a light receiving element using a VCSEL (laser diode) or a PD (photo diode) and an optical fiber using a PCF (Polymer Clad Fiber), the transmission speed is enhanced.

Preferably, the lead frame includes a substrate surface mounting part for being mounted on a surface of a substrate, and the substrate surface mounting part is integrally formed with the lead frame.

With the invention having such a characteristic, the optical element module is surface-mounted on the substrate Surface mounting delivers its advantages in terms of workability.

To solve the problem the invention also provides a method of assembling an optical element module, comprising:

providing a lead frame on which an optical element is mounted;

providing a tube body for receiving an optical fiber terminal;

molding a housing in a state that the lead frame is set into a forming mold;

applying an adhesive on a concave part provided on the housing; thereafter inserting a convex part provided on the tube body into the concave part; thereafter adjusting a fixing position of the tube body relative to the housing, and thereafter hardening the adhesive applied on the concave part.

Preferably, a marker for positioning the optical element is formed on the housing by an ejector pin of the forming mold in the molding process.

Preferably, the adhesive is thermo-setting epoxy adhesive, and the hardening process is performed by heat treatment.

The invention has an advantage that it is possible to provide an optical element module capable of reducing optical losses. This also delivers an advantage that it is possible to provide an optical element module useful for enhancement of transmission speed.

The invention has an advantage that it is possible to perform positioning of a tube body and an enclosure with high precision. This reduces optical losses more reliably.

The invention has an advantage that it is possible to mold an enclosure and perform positioning of a lead frame with high precision at the same time. This reduces optical losses more reliably. A marker enhances the positioning precision and reduces optical losses more reliably. The marker may be arranged and formed with high precision as well as formed without influencing costs.

The invention has an advantage that it is possible to arrange a light emitting element or a light receiving element with high precision. This reduces optical losses more reliably.

The invention has an advantage that it is possible to provide an optical element module less influenced by the ambient temperature.

The invention has an advantage that it is possible to enhance the transmission speed.

The invention has an advantage that it is possible to provide an optical element module with enhanced workability by way of surface-mounting of the optical element module on a substrate.

BRIEF DESCRIPTION OF THE DRAWINGS

The above objects and advantages of the present invention will become more apparent by describing in detail preferred exemplary embodiments thereof with reference to accompanying drawings, wherein like reference numerals designate like or corresponding parts throughout the several views, and wherein.

DETAILED DESCRIPTION

Figure 1:
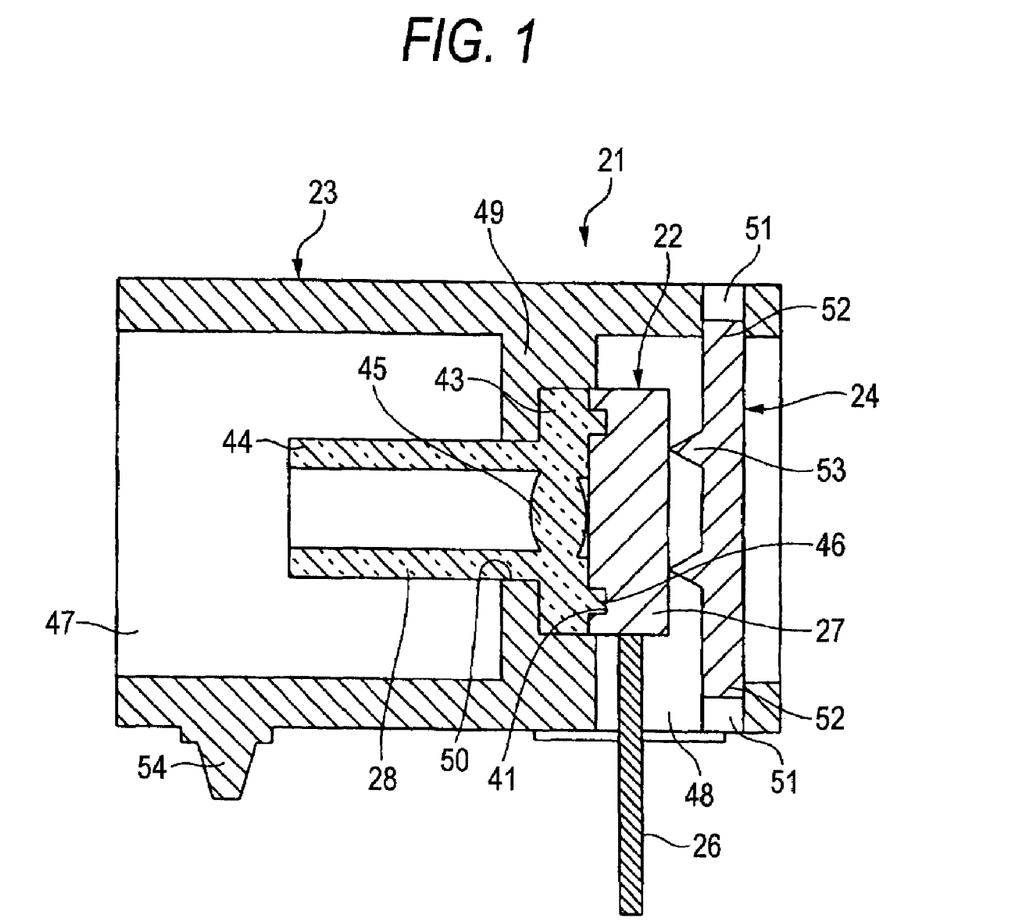
FIG. 1 is a cross-sectional view of an optical connector showing an embodiment of an optical element module according to the invention.
Figure 2:
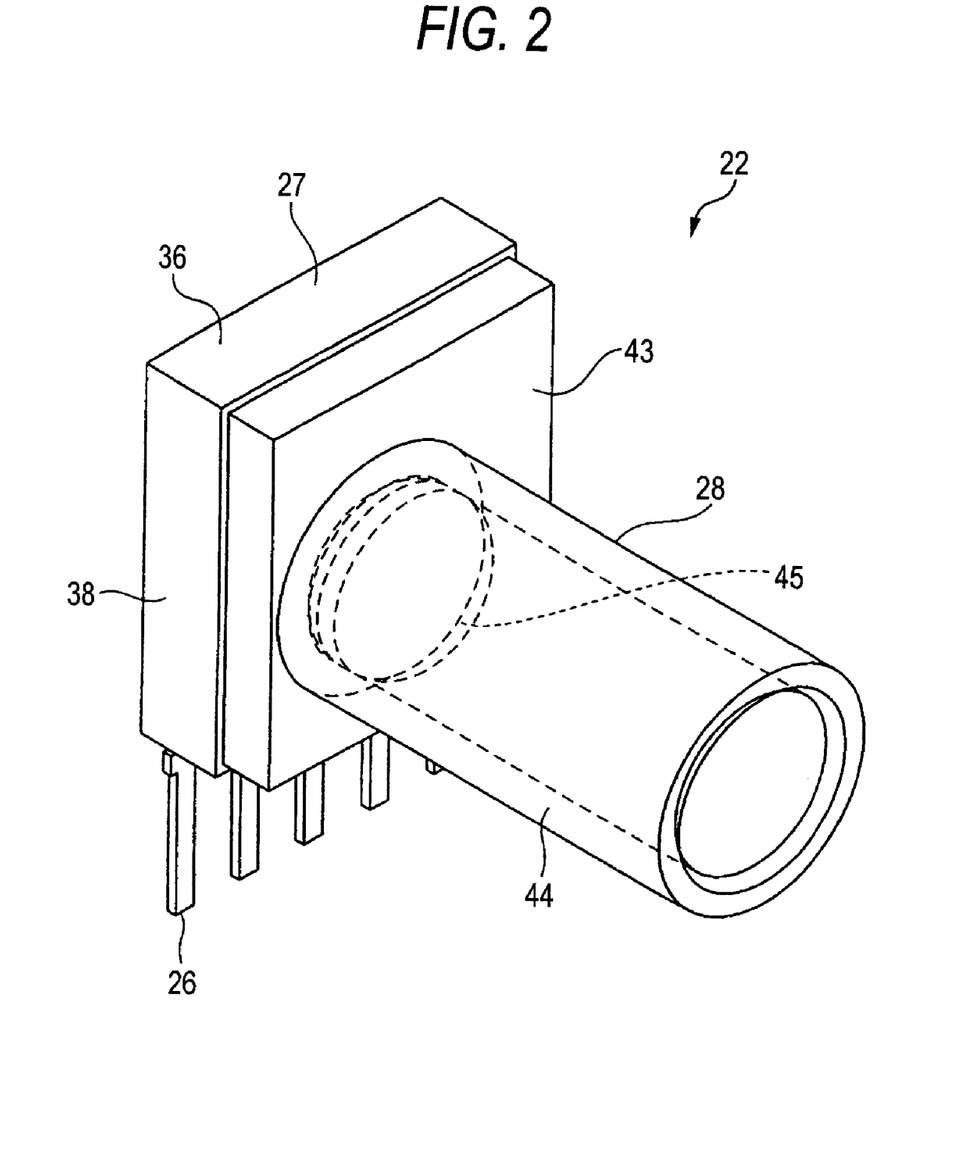
FIG. 2 is a perspective view of the optical element module according to the invention.

Referring to FIG. 1, an optical connector 21 used for optical communications includes an optical element module 22 according to the invention, an optical connector housing 23 made of a synthetic resin, and a housing cap 24 made of a synthetic resin.

The optical connector 21 in this embodiment is one mounted on a vehicle although the invention is not limited thereto. The optical connector 21 in this embodiment uses two optical element modules 22 according to the invention arranged side by side in the optical connector housing 23 for bidirectional optical communications although the invention is not limited thereto. Another optical element module is arranged at the back of the optical element modules 22 shown in FIG. 1. A configuration dedicated to transmission or reception may be made. The component members of the optical connector 21 will be described referring to FIGS. 1 through 5.

The optical element module 22 includes a light emitting element 25 (or light receiving element), a lead frame 26, a resin enclosure 27, a resin tube body 28, a silicone resin sealing part 29, an IC 30 and an electronic component 31.

The light emitting element 25 is mounted on the lead frame 26 together with the IC 30 and the electronic component 31. An optical signal output from the light emitting element 25 is generated by converting an electric signal. As the light emitting element 25, an LED or a VCSEL is generally known. In this example, a VCSEL is used to enhance the transmission speed. The light emitting element 25 is mounted on a small substrate 32 arranged on the lead frame 26.

The lead frame 26 is formed into an illustrated shape by blanking a conductive thin metallic plate. The lead frame 26 is not separated from a carrier formed via blanking until insert forming described later takes place or the light emitting element 25 is mounted.

The lead frame 26 has a through hole 33 formed on the center axis, for example. The through hole 33 is formed to penetrate the lead frame 26 in a diameter slightly larger than the diameter of an ejector pin described later. In close proximity to the through hole 33 is set an element mounting part 34 for the light emitting element 25. The element mounting part 34 is set in the size of the substrate 32. In close proximity to the element mounting part 34 are mounted the IC 30 and the electronic component 31.

An enclosure 27 is formed through resin molding where the lead frame 26 is inserted into a predetermined position. The enclosure 27 is formed into a rectangular shape having an opening at the front and including a shallow bottom. To be more precise, the enclosure 27 is formed to include a rear bottom wall 35, an upper wall 36, a lower wall 37, a left wall 38, a right wall 39 and an opening 40. The opening 40 is formed as a part opened by the ends of the upper wall 36, the lower wall 37, the left wall 38 and the right wall 39. The ends of the upper wall 36, the lower wall 37, the left wall 38 and the right wall 39 are formed to be continuous in a flat plane. In such a flat plane is formed a concave part 41.

Figure 4:
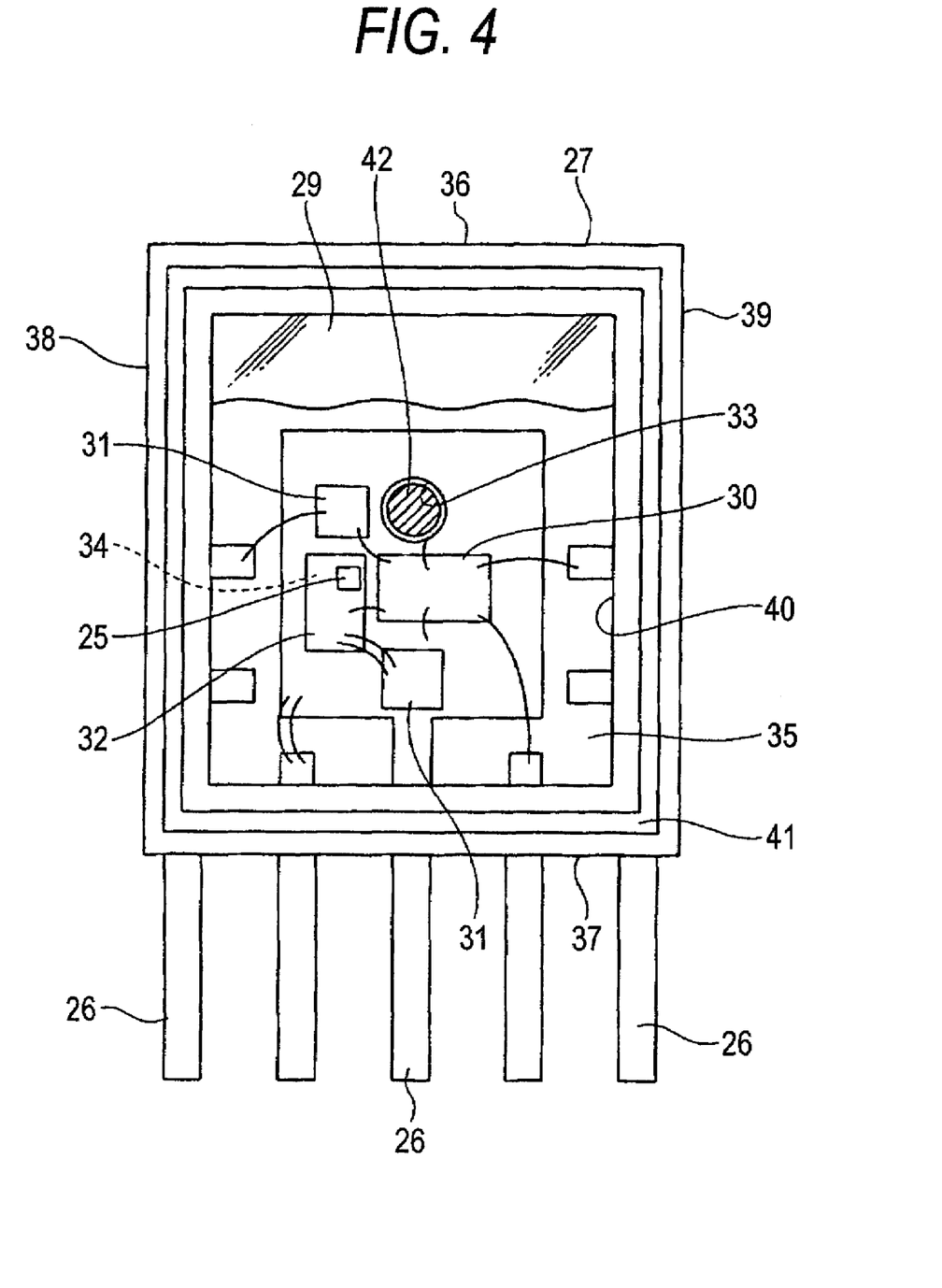
FIG. 4 is a front view of the optical element module in the sub-assembly state.

The concave part 41 is formed into a groove-shaped part that has a rectangular shape when the enclosure 27 is viewed from the front as shown in FIG. 4. The concave part 41 is formed outside the opening 40. The concave part 41 is formed as a non-locking uneven part on the enclosure 27. The cross-sectional shape of the concave part 41 is not limited to a rectangle or a square but may be a character of V or U. The shape of the concave part 41 is not particularly limited as long as the tube body 28 can be slightly moved for alignment with a non-locking uneven part (described later) on the tube body 28 inserted. To the concave part 41 is applied a fixing adhesive in the assembly process of the optical element module 22.

The enclosure 27 includes a marker 42 serving as a reference for positioning and used for viewing or image processing. The marker 42 is formed on the rear bottom wall 35 when the lead frame 26 is insert-molded into a predetermined position. To be more precise, the marker 42 is formed when the enclosure 27 is resin-molded. That is, the marker 42 is formed using the marks of the ejector pin of the forming mold. The marker 42 is formed in a position exposed from the through hole 33 of the lead frame 26. The marker 42 is formed by penetrating the ejector pin of the forming mold into the through hole 33 of the lead frame 26 in resin molding of the enclosure 27.

Figure 3:
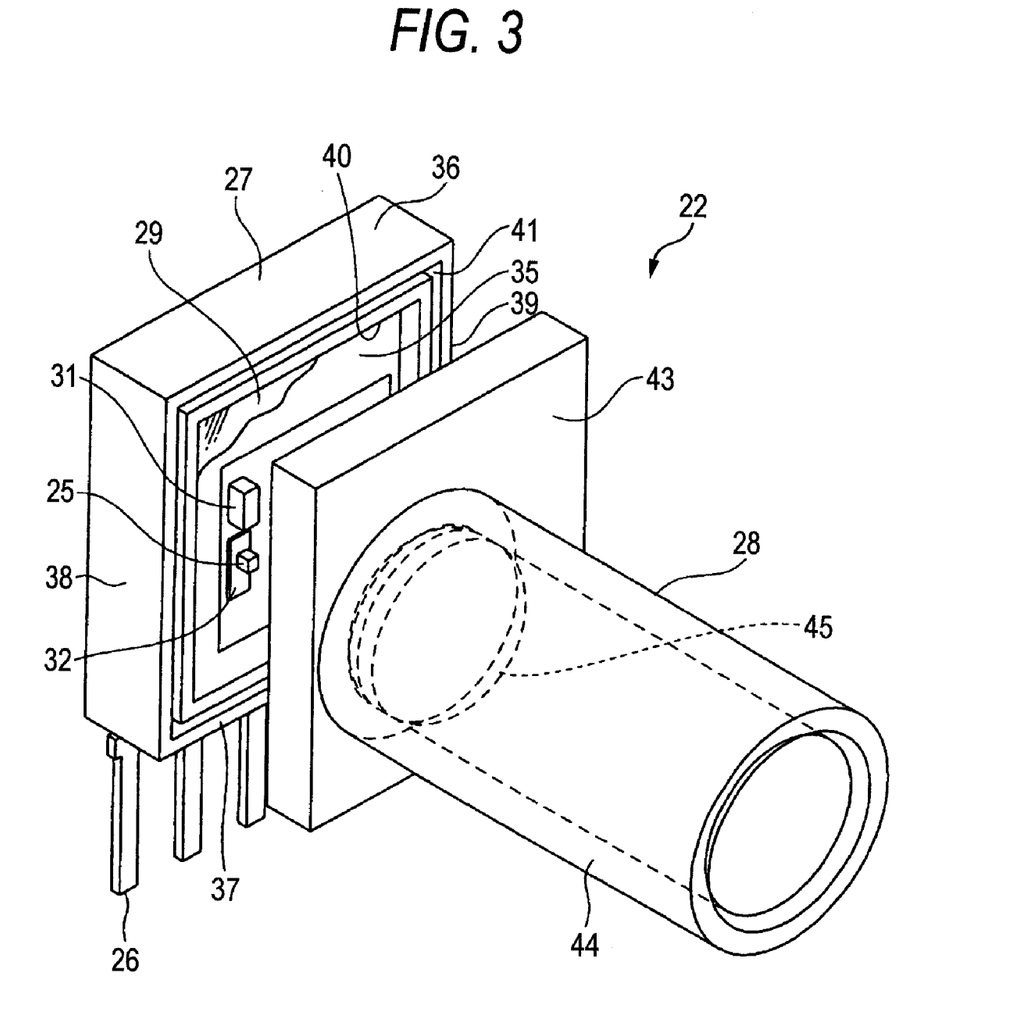
FIG. 3 is an exploded perspective view of the optical element module.

The tube body 28 is formed through resin molding that uses a resin material having optical transparency. The tube body 28 includes a lid part 43, a tube part 44 and a lens 45. The lid part 43, the tube part 44 and the lens 45 are formed integrally. The tube body 28 is formed of a single component including the lid part 43, the tube part 44 and the lens 45.

The lid part 43 is formed into a rectangular shape that can cover the opening 40 of the enclosure 27. On the lid part 43 is formed a convex part 46 for fixing via an adhesive at a position on a flat surface of each end of the upper wall 36, lower wall 37, left wall 38 and the right wall 39 of the enclosure 27. The convex part 46 is formed as a non-locking uneven part on the lid part 43. The convex part 46 is formed to the shape and arrangement of the concave part 41 of the enclosure 27.

The convex part 46 may be formed on the enclosure 27 and the concave part 41 may be formed on the lid part 43. The convex part 46 and the concave part 41 are formed in shapes to allow insertion and so that both parts are not engaged to each other. The convex part 46 and the concave part 41 are not designed to fix the tube body 28 and the enclosure 27. Fixing is basically made using an adhesive or equivalent means. The convex part 46 and the concave part 41 have dimensions so that a minute backlash (gap), that is, a backlash necessary for positioning described later will be provided when the convex part 46 is inserted into the concave part 41.

The tube part 44 is formed as a part into which the terminal of an optical fiber is inserted via a ferrule, or the terminal of an optical fiber is inserted directly. The tube part 44 is formed into a cylindrical shape. Inside the tube part 44 is integrated a lens 45 (or a lens 45 may be separately formed). The lens 45 is arranged in close proximity to the continuous part between the tube part 44 and the lid part 43 in this embodiment.

The lens 45 is arranged to be interposed between the terminal of an optical fiber and a light emitting element 25. The lens 45 is arranged considering the distance to the optical fiber terminal and the distance to the light emitting element 25. The lens 45 is formed to be convex on the surface facing the optical fiber terminal and on the surface facing the light emitting element 25. The lens 45 is formed so that both convex surfaces are aspherical.

As an optical fiber, a POF or a PCF is generally known. In this example, a PCF is used to enhance the transmission speed.

A silicone resin sealing part 29 is formed into an illustrated state by potting a silicone resin for sealing into the enclosure 27. The light emitting element 25, the IC 30 and the electronic component 31 mounted on the lead frame 26 are protected by the silicone resin sealing part 29. In this embodiment, the silicone resin sealing part 29 is formed so that its apex surface will be slightly lower than the opening 40.

In a space formed between the apex surface of the silicone resin sealing part 29 and the opening 40 with the tube body 28 mounted on the enclosure 27 exists air, which exits outside via a minute backlash between the convex part 46 and the concave part 41. In this embodiment, a non-fixed part is formed where an adhesive is not applied, where air moves toward the inside and outside.

Depending on a position of the lens 45 of the tube body 28, a space formed between the apex surface of the silicon resin sealing pad 29 and the opening 40 serves as a relief part to keep the lens 45 off the silicon resin sealing part 29.

Next, assembly of the optical element module 22 will be described based on the above configuration.

The lead frame 26 with a carrier attached (otherwise the lead frame 26 could break up) is set into a forming mold. Starting resin molding of the enclosure 27 in this state forms the enclosure 27 with part of the lead frame 26 insert-molded. On the enclosure 27 is formed a positioning marker 42 using the marks of an ejector pin of the forming mold (refer to FIG.

4). The ejector pin is arranged on the mold body with the dimensional precision of the forming mold. Thus, with such an ejector pin, the marker 42 is arranged with high precision.

In formation of the marker 42, the ejector pin penetrates the through hole 33 of the lead frame 26. When the enclosure 27 is resin-molded while the lead frame 26 is being inserted, the lead frame 26 is prevented from being moved by the flow of resin. This completes molding of the enclosure 27 and positioning of the lead frame 26 with high precision.

When the opening 40 is exposed after the enclosure 27 is resin-molded, part of the lead frame 26 is exposed. On the exposed part, the light emitting element 25, the IC 30 and the electronic component 31 are mounted and wiring is made. The light emitting element 25 and the like are mounted using the marker 42 as a positioning reference. Use of the marker 42 allows the light emitting element 25 to be arranged with high precision with respect to the lead frame 26 and the enclosure 27.

Figure 5:
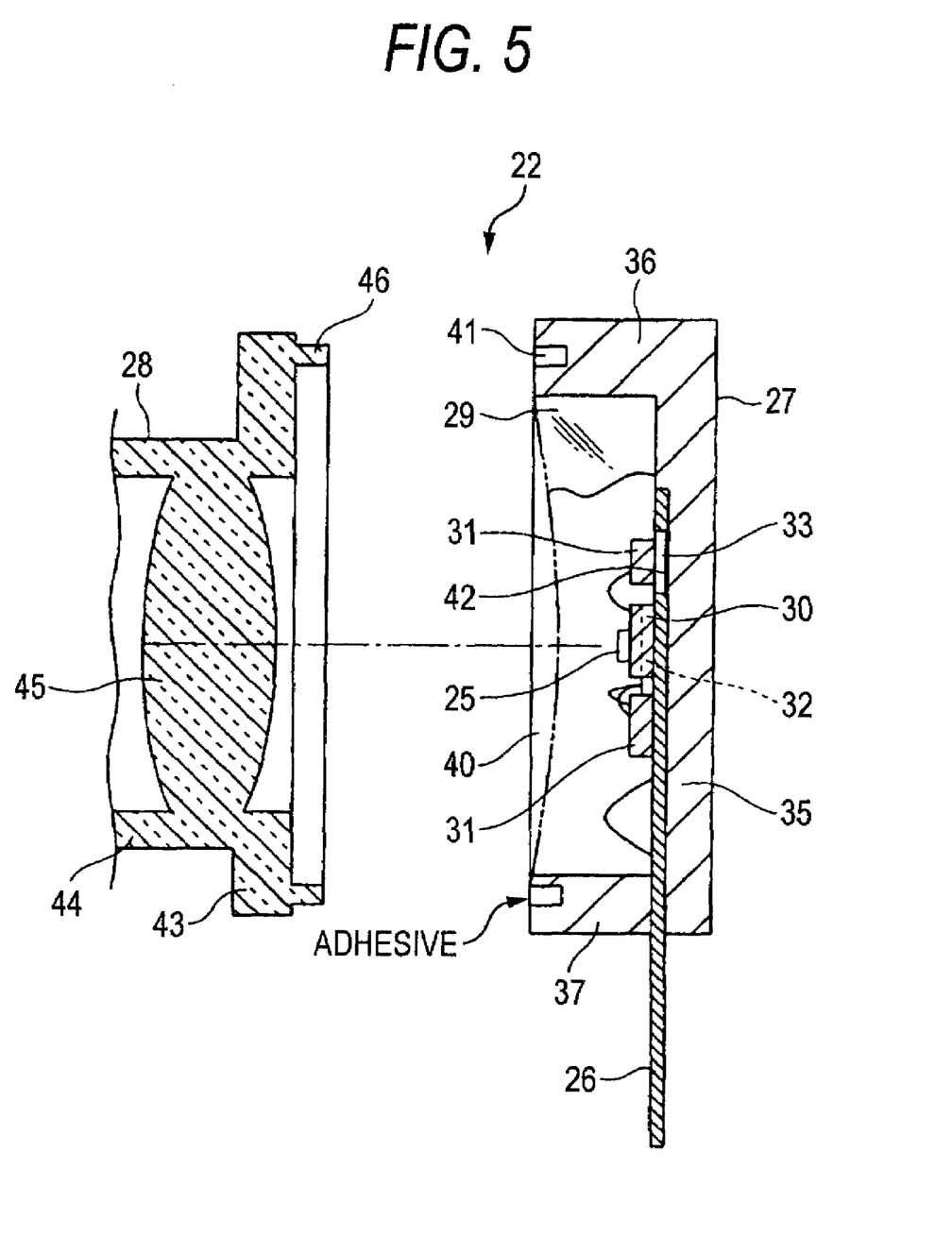
FIG. 5 is a cross-sectional view of the optical element module in the sub-assembly state.

Next, potting of a silicone resin for sealing is made to the enclosure 27. This process forms a silicone resin sealing part 29 in the enclosure 27. The light emitting element 251 the IC 30 and the electronic component 31 mounted on the lead frame 26 are protected by the silicone resin sealing part 29. When the light emitting element 25, the IC 30 and the electronic component 31 mounted on the lead frame 26 are protected by the silicone resin sealing part 29 and the lead frame 26 is detached from the carrier, a sub-assembly as a state before the tube body 28 is fixed is formed as shown in FIGS. 4 and 5.

Next, the tube body 28 is fixed to the enclosure 27 by using an adhesive. This work includes a temporary fixing step of applying an adhesive to the concave part 41 of the enclosure 27 and inserting the convex part 46 of the tube body 28 therein, and determining the fixing position of the tube body 28 while using the light emitting element 25 as a positioning reference, and a final fixing step of letting the adhesive harden that is applied to the concave part 41 and completely fixing the tube body 28 to the enclosure 27.

In this embodiment, the adhesive used is for example a thermo-setting epoxy adhesive. The adhesive is applied to the concave part 41 for example on the upper wall 36 and the lower wail 37 of the enclosure 27, and completely secures the tube body 28 onto the enclosure 27 when it hardens with heat treatment (for example, for one hour at 100° C.) after the temporary fixing step.

In the temporary fixing step, when the tube body 28 is minutely moved to determine the fixing position by using the light emitting element 25 as a reference, each of the left wall 38 and the right wall 39 of the enclosure 27 and the lid part 43 of the tube body 28 are partially fixed to each other with an instant adhesive (a cyanoacrylate instant adhesive having a UV bonding feature). Partial fixing may be made through laser-based welding. This maintains the enclosure 27 and the tube body 28 in stable position without dislocating from each other while a thermo-setting epoxy adhesive is hardening. Once the thermo-setting epoxy adhesive hardens, the tube body 28 is fixed to the enclosure 27 with the center axis of the tube part 44 aligned with the light emitting element 25.

When the thermo-setting epoxy adhesive hardens and the tube body 28 is completely secured to the enclosure 27, assembly of the optical element module 22 is complete.

The optical element module 22 is assembled with positioning of the components being excellent as understood from foregoing description. This considerably reduces optical losses when compared with the related art.

Assuming a case where the light emitting element 25 is misaligned with the optical fiber thus causing displacement of the optical axis, the lens 45 integral with the tube body 28 acts to absorb the displacement of the optical axis in the optical element module 22 according to the invention. Optical losses are reduced in this case also.

The lens 45 is integrated with the tube part 44 of the tube body 28 so that no backlash occurs therebetween. An excellent alignment of the tube body 28 and the light emitting element 25 will reliably reduce optical losses.

An optical connector housing 23 constituting the optical connector 21 is formed into a shape with its front surface and rear surface open respectively as illustrated. The opening on the front surface is formed as a connector fitting pad 47 into which a counterpart optical connector is fitted. The opening on the rear surface is formed as a module receiving part 48 for receiving the optical element module 22 of the invention. Between the connector fitting part 47 and the module receiving pad 48 is formed a partition wall 49. A through hole 50 is formed in the partition wall 49. The through hole 50 is formed into a stepped shape so that the tube part 44 of the optical element module 22 of the invention will be inserted and the lid part 43 will be abutted on the stepped part when the optical element module 22 of the invention is received in the module receiving part 48.

The optical connector housing 23 is formed so that the tube part 44 will protrude into the connector fitting part 47 when the optical element module 22 of the invention is received in the module receiving part 48. When the tube part 44 protrudes into the connector fitting part 47, the ferrule of the counterpart optical connector is inserted into the tube part 44 and guided into position when optical connectors are fitted into each other.

A housing cap 24 includes a locking projection 52 engaged to a locking concave part 51 formed on the module receiving part 48 of the optical connector housing 23. The housing cap 24 includes a plurality of pressing parts 53 for pressing the optical element module 22 of the invention against the partition wall 49 of the optical connector housing 23 while locked to the module receiving part 48.

When the optical element module 22 is received in the module receiving part 48 and the housing cap 24 is locked to the module receiving part 48, assembly of the optical connector 21 is complete. The optical element module 22 of the invention is fixed without a backlash.

When assembly of the optical connector 21 is complete, the optical connector 21 is fixed to the surface of a substrate. The lead frame 26 of the optical element module 22 of the invention penetrates the through hole of the substrate and is soldered to the rear surface of the substrate. Part of the lead frame 26 may be bent and mounted on the substrate. A numeral 54 represents a substrate fixing part formed on the optical housing 23. The substrate fixing part 54 is inserted into the substrate and is fixed thereto.

Figure 6:
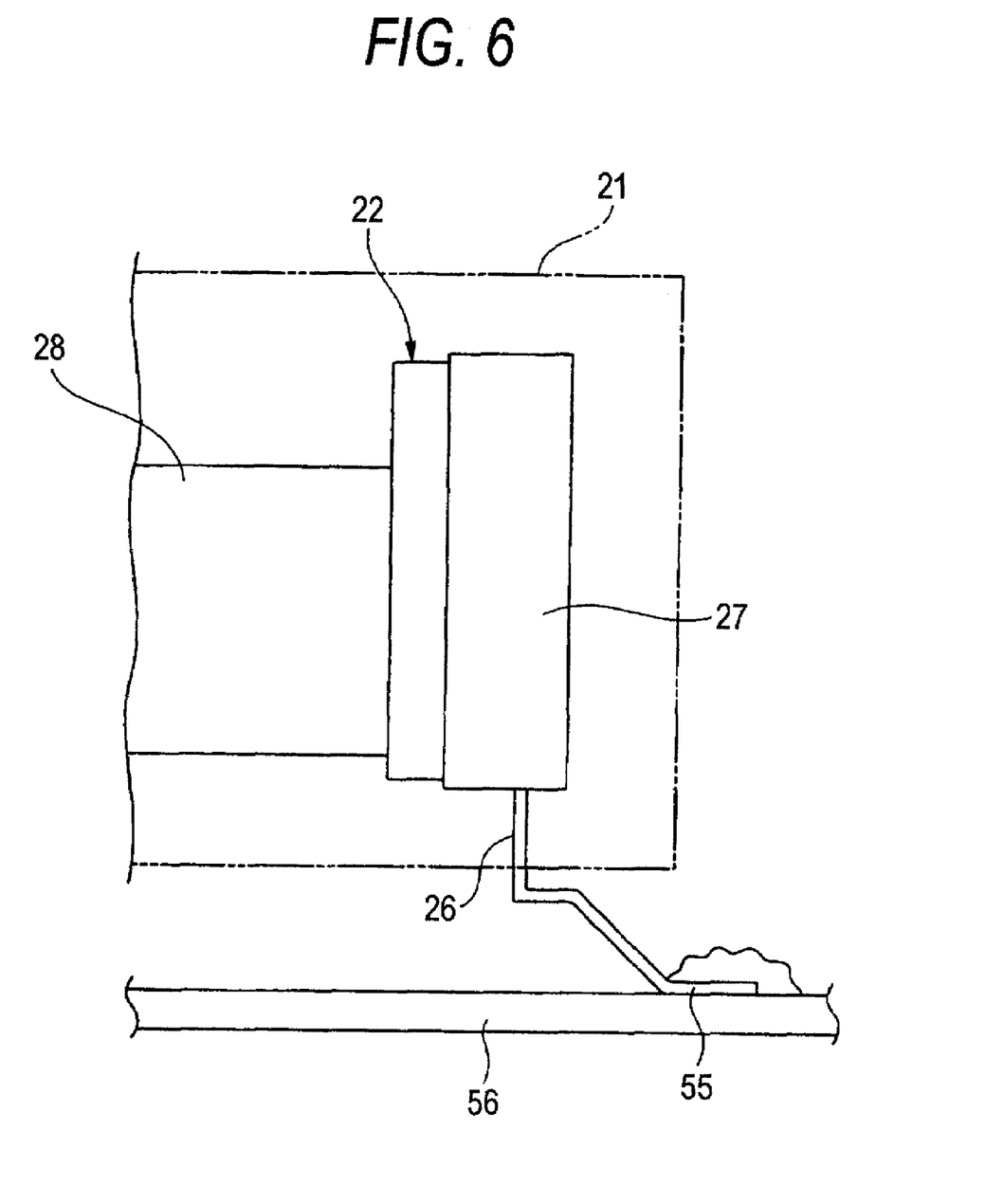
FIG. 6 is an explanation drawing related to a variation of the optical element module 22 according to the invention.

Next, a variation of the optical element module 22 of the invention will be described referring to FIG. 6. FIG. 6 is an explanatory drawing of the variation.

In FIG. 6, the lead frame 26 of the optical element module 22 includes a substrate surface mounting part 55 formed by bending. The optical element module 22 is designed to be surface-mounted on the substrate 56 via the substrate surface mounting part 55 of the lead frame 26. With the substrate surface mounting part 55 included on the lead frame 26, the optical element module 22 delivers enhanced workability when compared with the above embodiment.

The invention may be modified in various ways without departing from the scope and spirit thereof.

While not described with corresponding illustration, an optical element module including a light receiving element (PD) is basically the same as the above optical element module 22.

What is claimed is:

1. An optical element module, comprising:
   a lead frame;
   an optical element mounted on the lead frame;
   a resin housing including an opening part, and contains a part of the lead frame on which the optical element is mounted; and
   a tube body including:
      a tube part for receiving an optical fiber terminal;
      a lens arranged between the optical element and the optical fiber terminal; and
      a lid part which covers the opening part of the resin housing,
   wherein the tube part, the lens and the lid part are integrally formed;
   wherein the housing and the lid part have a non-lock concave part and a non-lock convex part, respectively; and
   wherein a gap for adjusting a relative position of the housing relative to the tube body is formed between the concave part and the convex part when the convex part is inserted into the concave part.

2. The optical element module according to claim 1,
   wherein the lead frame has a through-hole; and
   wherein the housing has a marker for positioning the optical element at a position overlapped with the through-hole.

3. The optical element module according to claim 2,
   wherein the lead frame has a device mounting part near the through-hole.

4. The optical element module according to claim 1,
   wherein a part of the gap is filled with an adhesive; and
   wherein inside of the optical element is communicated with outside of the optical element through a part except the part of the gap.

5. The optical element module according to claim 1,
   wherein the optical element is Vertical Cavity Surface Emitting Laser (VCSEL) or Photo Diode (PD); and
   wherein the optical fiber is Polymer Clad Fiber (PCF).

6. The optical element module according to claim 1,
   wherein the lead frame includes a substrate surface mounting part for being mounted on a surface of a substrate; and
   wherein the substrate surface mounting part is integrally formed with the lead frame.

7. A method of assembling an optical element module, comprising:
   providing a lead frame on which an optical element is mounted;
   providing a tube body for receiving an optical fiber terminal;
   molding a housing in a state that the lead frame is set into a forming mold;
   applying an adhesive on a concave part provided on the housing; thereafter
   inserting a convex part provided on the tube body into the concave part; thereafter
   adjusting a fixing position of the tube body relative to the housing; and thereafter
   hardening the adhesive applied on the concave part.

8. The method of assembling the optical element module according to claim 7,
   wherein a marker for positioning the optical element is formed on the housing by an ejector pin of the forming mold in the molding process.

9. The method of assembling the optical element module according to claim 7,
   wherein the adhesive is thermo-setting epoxy adhesive; and
   wherein the hardening process is performed by heat treatment.

10. The optical element module according to claim 1,
    wherein the resin housing further comprises a non-tube body side and a tube body side;
    wherein the tube body side is located closer to the tube body than the non-tube body side;
    wherein a bottom wall is provided on the tube body side of the resin housing;
    wherein periphery walls are provided on the periphery of the bottom wall;
    wherein the periphery walls extend from the bottom wall towards the tube body; and
    wherein the opening part is formed in the portion of the resin housing between the bottom wall and the periphery walls.

11. An optical element module, comprising:
    an optical element;
    a housing on which the optical element is provided;
    a tube body including:
       a tube part for receiving an optical fiber terminal; and
       a connecting portion which connects the tube body to the housing;
    wherein the housing has either a non-lock concave part or a non-lock convex part;
    wherein, if the housing has the non-lock concave part, the connecting portion of the tube body has the non-lock convex part;
    wherein, if the housing has the non-lock convex part, the connecting portion of the tube body has the non-lock concave part; and
    wherein a gap for adjusting a relative position of the housing to the tube body is formed between the concave part and the convex part when the convex part is inserted into the concave part.

12. The optical element module according to claim 11,
    wherein a part of the gap is filled with an adhesive;
    wherein another part of the gap is not filled with an adhesive; and
    wherein air is able to move in and out from an area between the housing and the tube body through the part of the gap that is not filled with an adhesive.

13. A method of assembling an optical element module, comprising:
    providing a tube body for receiving an optical fiber terminal;
    providing a housing with an optical element provided on the housing;
    applying an adhesive on a concave part provided either on the housing or the tube body; thereafter
    inserting a convex part provided on the tube body into the concave part if the concave part is provided on the housing, or inserting a convex part provided on the housing into the concave part if the concave part is provided on the tube body; thereafter
    adjusting a fixing position of the tube body relative to the housing; and thereafter
    hardening the adhesive applied to the concave part.

* * * * *